United States Patent
Kaire et al.

Patent Number: 5,339,042
Date of Patent: Aug. 16, 1994

[54] INPUT STAGE OFFSET COMPENSATION DEVICE

[75] Inventors: Jean-Claude Kaire, Vourey; Bernard Majoux, Meylan; Serge Pontarollo, Pont de Claix, all of France

[73] Assignee: SGS-Thomson Microelectronics S.A., Saint-Genis Pouilly, France

[21] Appl. No.: 10,605

[22] Filed: Jan. 28, 1993

[30] Foreign Application Priority Data

Jan. 31, 1992 [FR] France .................. 92 01312

[51] Int. Cl.⁵ ............................ H03F 3/45
[52] U.S. Cl. ..................... 330/255; 330/257; 330/261
[58] Field of Search ................. 330/255, 257, 261

[56] References Cited

U.S. PATENT DOCUMENTS 4,612,464  9/1986  Ishikawa et al. ............. 307/496
5,045,806  9/1991  Yan ............................ 330/252

FOREIGN PATENT DOCUMENTS 9107815  5/1991  PCT Int'l Appl. ............. 330/261

OTHER PUBLICATIONS

Patent Abstracts of Japan, vol. 6, No. 25 (E-94)(903) Feb. 13, 1982 & JP-A-56144614 (Toukou K.K.) Nov. 11, 1981.

Primary Examiner—James B. Mullins
Attorney, Agent, or Firm—Wolf, Greenfield & Sacks

[57] ABSTRACT

A device for compensating the offset of an input stage having two current output legs, the first of which is connected to the input of a real stage pushing into this first leg a parasitic current; the device including a fake stage pushing a compensation current having a value equal to the value of the parasitic current divided by a predetermined factor greater than 1, this compensation current being amplified by an amplifier having a gain equal to said predetermined factor, before being pushed into the second output leg of the input stage.

22 Claims, 3 Drawing Sheets

INPUT STAGE OFFSET COMPENSATION DEVICE

BACKGROUND OF THE INVENTION

The present invention relates to operational amplifiers and in particular to a device for compensating the input offset voltage of an amplifier.

FIG. 1 very schematically shows an amplifier structure. This amplifier comprises a differential input stage 10 powered between a high potential Vcc and a low potential Vss. This stage can comprise multiple elementary gain stages comprised of transistors assembled as differential amplifiers. Stage 10 comprises a differential output comprised of two legs D+ and D− respectively carrying a direct current and a current of opposite phase, both proportional to the voltage present between two input terminals E+ and E− of stage 10. These currents in legs D+ and D− are added to a bias current Id. Legs D− and D+ are respectively connected to the input and to the output of a current mirror M1 coupled to the low potential Vss. Leg D+ is also connected to the input of an output stage 11 comprising a control stage 12 controlling, for example, via an output N and an output P the respective bases of "push-pull" connected transistors Q and QP.

FIG. 2 shows an exemplary constitution of a current mirror depending on the low potential Vss, which can be used for mirror M1 and for mirrors which will be described later. This mirror comprises two NPN transistors QMA and QMB, the emitters of which are connected to the low potential Vss, and the bases of which are connected to each other. The collector and the base of transistor QMB are connected to the emitter of a transistor QMC, the base of which is connected to the collector of transistor QMA. The input of the mirror corresponds to the collector of transistor QMA and the output to the collector of transistor QMC. The output current of such a mirror is substantially equal to the input current multiplied by the surface ratio of transistors QMB and QMA.

In the output stage 11 of FIG. 1, a current source IP connected to the high potential Vcc and a current source $I_N$ connected to the low potential Vss establish the bias currents of transistors of the control stage 12. A detailed exemplary schematic diagram of stage 12 providing a follower stage will be described later.

With this configuration, a current equal to the difference between the current in leg D+ and the current in leg D− is provided to the input of the control stage 12. If stage 12 is perfect, a same bias current Id is present in both legs D+ and D−, the current consumed by stage 12 from leg D+ being zero.

However, stage 12 always pushes (as shown) or pulls a parasitic current $I_O$ in leg D+. This parasitic current causes a bias current offset in legs D+ and D− which results in an input offset voltage $V_O$ which must be applied between terminals E+ and E− for compensating the current offset. This offset voltage $V_O$ is particularly great in fast amplifiers which comprise an input stage 10 with only one gain stage. Moreover, in fast amplifiers, the output stage has a high bias current and tends to therefore push a high parasitic current in leg D+.

In order to compensate for this disadvantage in conventional fast operational amplifiers, one of the bias currents of control stage 12, generally current $I_N$, is adjusted after the manufacturing of the chip of the operational amplifier. This adjustment is generally achieved by laser trimming a resistor. This operation substantially increases the cost of the chip.

FIG. 3 shows in detail a conventional configuration of control stage 12 that provides a follower stage. The input of stage 12 corresponds to the bases of an NPN transistor $QD_1$ and of a PNP transistor $QDP_1$ connected in common collector configuration. Current sources IP and $I_N$ are respectively connected to the emitters of transistors $QDP_1$ and $QD_1$, and establish the bias current of these transistors. The emitters of transistors $QDP_1$ and $QD_1$ respectively correspond to the outputs N and P of control stage 12. With this configuration, transistor $QDP_1$ and $QD_1$ consume base currents of respectively $Ip/\beta p$ and $I_N/\beta_N$, where $\beta p$ and $\beta_N$ designate the respective gains of transistors $QDP_1$ and $QD_1$. Thus, parasitic current $I_0$ is equal to:

$$I_0 = IP/\beta_P - I_N/\beta_N.$$

In general, on the same chip, the gains of the PNP transistors are independent of and lower than the gains of the NPN transistors. The values of currents $I_P$ and $I_N$ are selected in order to cancel the parasitic current $I_0$ for typical values of gains $\beta_P$ and $\beta_N$. However, in most cases where these gains are different from their typical values, a parasitic current $I_0$ subsists. As previously mentioned, an expensive solution includes trimming the value of one of the currents $I_P$ and $I_N$ after manufacturing the chip.

FIG. 4 shows a solution used in conventional non-fast operational amplifiers (with more than one gain stage). As in FIG. 1, output legs D− and D+ of an input stage are connected to a current mirror M1. An output stage 11 pushes a parasitic current $I_0$ in leg D+. Leg D− is connected to a fake stage 24 which has the same input characteristics as stage 11, i.e. it pushes a current $I_0$ in leg D−.

With this configuration, legs D− and D+ are balanced and the input offset voltage of the amplifier is compensated.

However, fake stage 24, in order to have the same characteristics as stage 11, must comprise transistors having the same bias current as that of the corresponding transistors of stage 11. If this assembly is used in a fast operational amplifier, the power consumption of the amplifier is increased by approximately 40% for an amplifier already consuming a high current (for example about 20 mA). For this reason, fast operational amplifiers having a fake stage are not manufactured.

SUMMARY OF THE INVENTION

An object of the invention is to realize a low cost input stage offset compensation device.

Another object of the invention is to realize such a device moreover having a low power consumption.

These objects are achieved by a compensation device comprising a fake output stage having a bias current K times smaller than the bias current of a real output stage connected to a first output leg of an input stage. The current derived by the fake output stage is multiplied by K in a current multiplier before being applied to the second output leg of the input stage.

The invention more particularly provides a device for compensating the offset of an input stage having two current output legs, the first of which is connected to the input of a real stage pushing into this first leg a parasitic current. According to the invention, the device comprises a fake stage pushing a compensation current having a value equal to the value of the parasitic current divided by a predetermined factor greater than 1, this compensation current being amplified by an amplifier having a gain equal to said predetermined factor, before being pushed in the second output leg of the input stage.

BRIEF DESCRIPTION OF THE DRAWINGS

The foregoing and other objects, features and advantages of the invention will be exposed in more detail in the following description of preferred embodiments by referring to the accompanying drawings among which.

In the figures, currents are represented by arrows indicating a positive polarity or flowing direction. Terms such as "derived", "pushed", "pulled". . . for qualifying a current do not indicate the flowing direction or polarity of a current.

DESCRIPTION OF PREFERRED EMBODIMENTS

Figure 1:
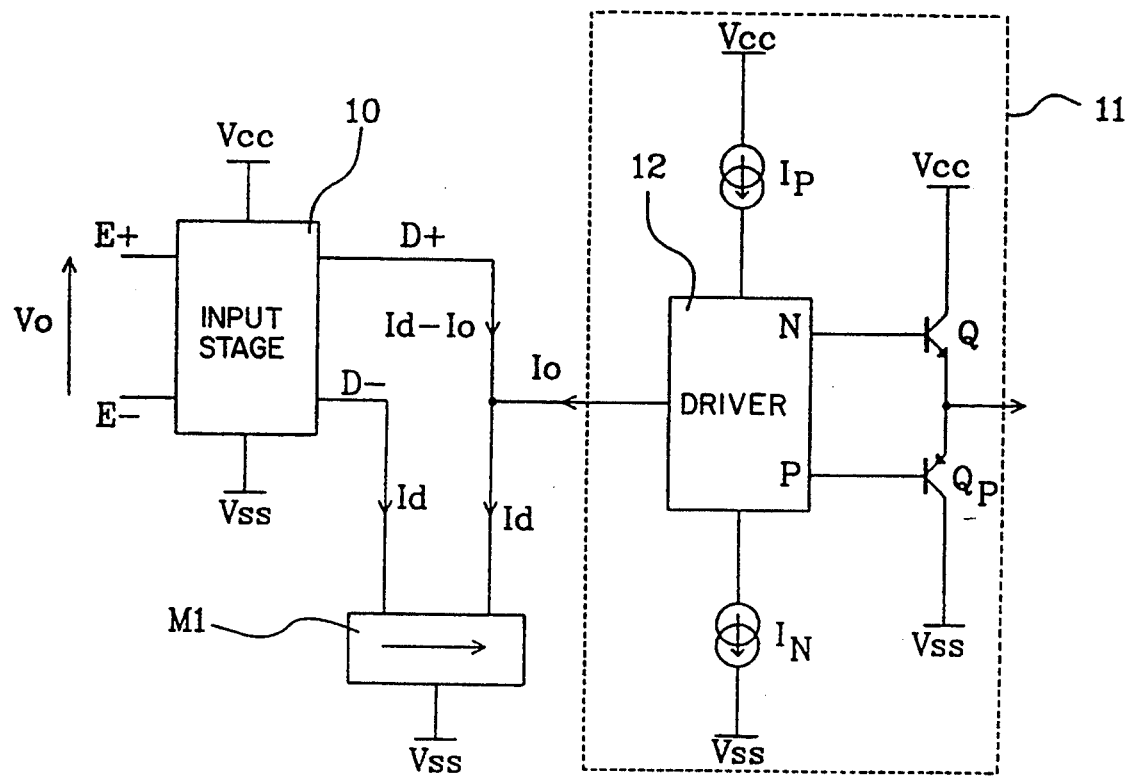
FIG. 1, previously described, schematically shows an architecture of a conventional fast operational amplifier without compensation device.
Figure 2:
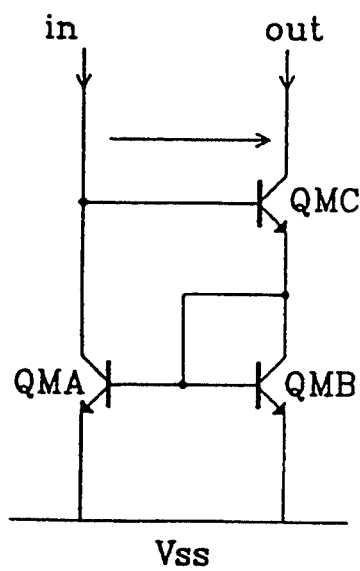
FIG. 2, previously described, shows a current mirror configuration.
Figure 5:
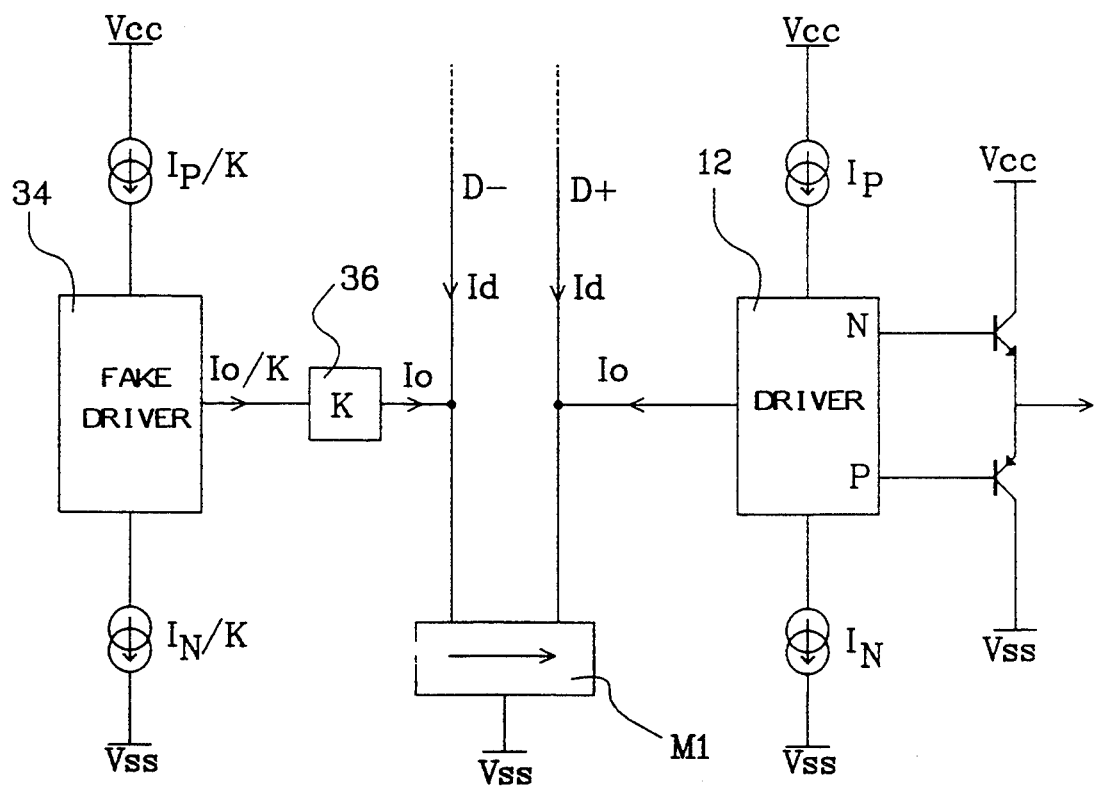
FIG. 5 shows a compensation device according to the invention inserted in the amplifier of FIG. 1.

In FIG. 5, same elements as those in FIG. 1 are designated by same reference numerals. The compensation device according to the invention comprises a fake control stage 34 having the same configuration as that of control stage 12, except that the bias current of the fake stage is established by current sources IP/K and $I_N$/K delivering currents K times smaller than the currents delivered by sources IP and $I_N$ of control stage 12. Thus, fake stage 34 pushes a current equal to $I_O$/K ($I_O$ being the value of the parasitic current pushed by stage 12). This current $I_O$/K is multiplied by K by an amplifier 36 before being pushed in output leg D— of the input stage.

Thus, the bias currents of both output legs D— and D+ of the input stage are balanced due to a fake control stage 34 that consumes K times less current than a conventional fake stage.

Figure 3:
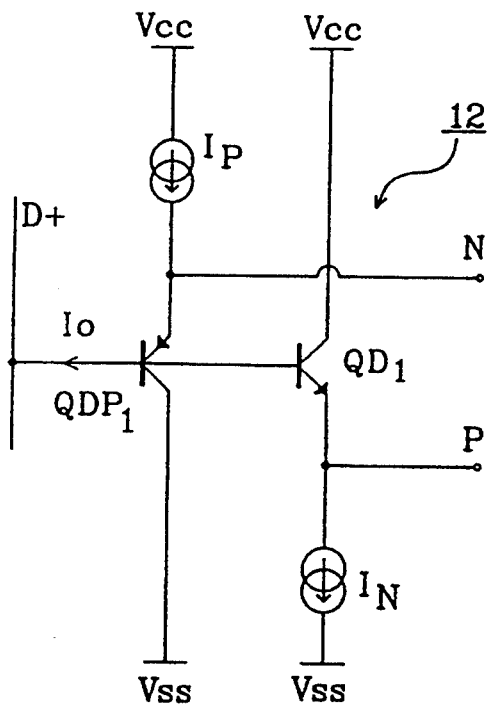
FIG. 3, previously described, shows a configuration of a control stage used in the amplifier of FIG. 1.
Figure 4:
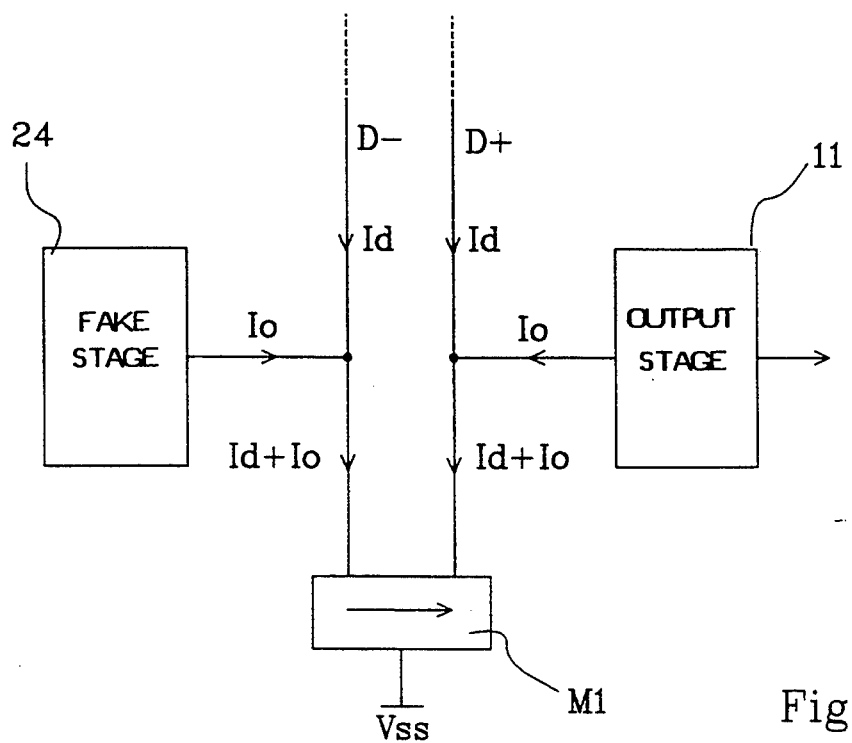
FIG. 4, previously described, shows a conventional compensation device inserted in the amplifier of FIG. 1.
Figure 6:
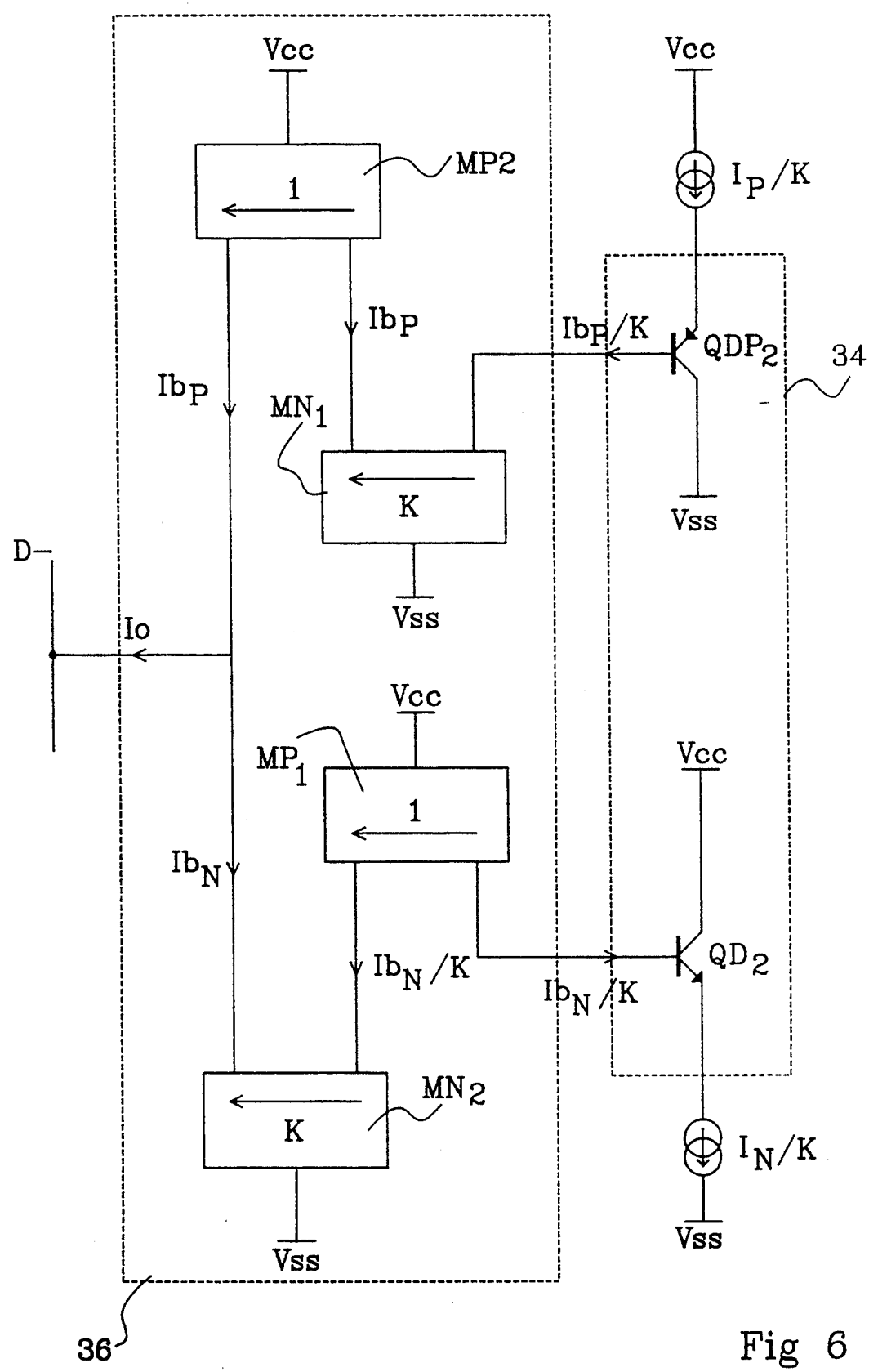
FIG. 6 shows an embodiment of a compensation device according to the invention.

FIG. 6 shows an embodiment according to the invention of amplifier 36 and an embodiment of the fake control stage 34. This embodiment is adapted to an operational amplifier having a control stage 12 of the type of FIG. 3. Stage 34 comprises an NPN transistor $QD_2$ and a PNP transistor $QDP_2$ corresponding respectively to transistors $QD_1$ and $QDP_1$ of stage 12 of FIG. 3. The bases of transistors $QD_2$ and $QDP_2$, instead of being connected together as in stage 12, are connected respectively to the inputs of a current mirror $MP_1$ coupled to the high potential Vcc and of a current mirror $MN_1$ coupled to the low potential Vss. The outputs of mirrors $MP_1$ and $MN_1$ are respectively connected to the inputs of a current mirror $MN_2$ coupled to the low potential Vss and of a current of a mirror $MP_2$ coupled to the high potential Vcc. The outputs of mirrors $MP_2$ and $MN_2$ are connected together and constitute the output of amplifier 36 connected to the leg D— of the input stage.

With this configuration, the base currents of transistors $QD_2$ and $QDP_2$, the polarity of which is known, are amplified separately and subtracted at the level of leg D—.

In a preferred embodiment, such as indicated in FIG. 6, the mirrors MP coupled to the high potential Vcc have a unity gain and the mirrors MN coupled to the low potential Vss have a gain K. This is preferred because the mirrors coupled to the low potential are NPN transistor mirrors which are generally faster than PNP transistors and because the gains $\beta$ of the NPN transistors are generally higher, which results in better accuracy of the multiplication factor K.

The present invention has been described with a particular type of output stage, but those skilled in the art will know how to adapt it to any other type of stage.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A device for compensating an offset of an input stage having first and second current output legs, the first output leg connected to an input of a real stage that pushes a parasitic current into the first leg, comprising:
    a fake stage providing a compensation current having a value equal to a value of the parasitic current divided by a predetermined factor greater than one; and
    an amplifier, coupled to an output of the fake stage, and to the second leg having a gain equal to the predetermined factor and amplifying the compensation current before the compensation current is pushed into the second leg.

2. The device of claim 1, wherein the real stage and the fake stage have respective bias currents, the bias current of the fake stage being equal to the bias current of the real stage divided by the predetermined factor.

3. The device of claim 2, wherein the real stage and the fake stage each comprise:
    first and second transistors of different polarities;
    two current sources respectively establishing bias currents for the two transistors; and
    wherein the first and second transistors in the real stage have respective bases that are directly connected to the first output leg of the input stage.

4. The device of claim 3, wherein the amplifier comprises, for each of the first and second transistors of the fake stage:
    a first current mirror coupled to and powered by a first potential and having an input connected to the base of the transistor;
    a second current mirror coupled to and powered by a second potential and having an output connected to the second output leg of the input stage; and
    wherein at least one of the first and second current mirrors is a multiplier mirror so that a base current of the transistor is multiplied by the predetermined factor before being pushed into the second leg.

5. The device of claim 4, wherein, for the first transistor, the first current mirror is the multiplier mirror having a multiplication factor equal to the predetermined factor.

6. The device of claim 5, wherein, for the first transistor, the first potential is a low potential and the second potential is a high potential.

7. The device of claim 4, wherein, for the second transistor, the second current mirror is the multiplier mirror having a multiplication factor equal to the predetermined factor.

8. The device of claim 7, wherein, for the second transistor, the first potential is a high potential and the second potential is a low potential.

9. The device of claim 4, wherein the potential that powers the multiplier mirror is a low potential.

10. The device of claim 1, wherein the offset is a current offset.

11. The device of claim 1, wherein the offset is a voltage offset.

12. A device for compensating an offset of an input stage having first and second current output legs, the first output leg coupled to an input of a real stage that pushes a parasitic current into the first leg, comprising:
fake stage means for providing a compensation current having a value substantially equal to a value of the parasitic current divided by a predetermined factor greater than one; and
amplifier means, coupled to an output of the fake stage means and to the second leg, and having a gain substantially equal to the predetermined factor, for amplifying the compensation current before the compensation current is pushed into the second leg.

13. The device of claim 12, wherein the real stage and the fake stage means have respective bias currents, the bias current of the fake stage means being equal to the bias current of the real stage divided by the predetermined factor.

14. The device of claim 13, wherein the real stage and the fake stage means each comprise:
two transistors of different polarities;
two current source means for respectively establishing bias currents for the two transistors; and
wherein the two transistors in the real stage have respective bases that are directly connected to the first output leg of the input stage.

15. The device of claim 13, wherein the amplifier means comprises:
a first means for current mirroring coupled to and powered by a first potential;
a second means for current mirroring coupled to and powered by a second potential; and
wherein at least one of the first and second means for current mirroring includes means for multiplying a current from the fake stage means by the predetermined factor.

16. The device of claim 15, wherein the first means for current mirroring includes the means for multiplying having a multiplication factor substantially equal to the predetermined factor.

17. The device of claim 16, wherein the first potential is a low potential and the second potential is a high potential.

18. The device of claim 15, wherein the second means for current mirroring includes the means for multiplying having a multiplication factor substantially equal to the predetermined factor.

19. The device of claim 18, wherein the first potential is a high potential and the second potential is a low potential.

20. The device of claim 12, wherein the offset is a current offset.

21. The device of claim 12, wherein the offset is a voltage offset.

22. A method for compensating an offset of an input stage having first and second current output legs, the first output leg connected to an input of a real stage that pushes a parasitic current into the first leg, comprising the steps of:
providing a compensation current having a value equal to a value of the parasitic current divided by a predetermined factor greater than one; and
amplifying the compensation current by an amount equal to the predetermined factor before pushing the compensation current into the second leg.

* * * * *